United States Patent [19]

Spitzer

[11] Patent Number: 5,138,403
[45] Date of Patent: Aug. 11, 1992

[54] HIGH TEMPERATURE SCHOTTKY BARRIER BYPASS DIODES

[75] Inventor: Mark B. Spitzer, Sharon, Mass.
[73] Assignee: Kopin Corporation, Taunton, Mass.
[21] Appl. No.: 754,330
[22] Filed: Sep. 4, 1991

Related U.S. Application Data

[63] Continuation of Ser. No. 428,124, Oct. 27, 1989, abandoned.

[51] Int. Cl.⁵ .................. H01L 29/48; H01L 23/48
[52] U.S. Cl. ........................... 357/15; 357/30; 357/68; 357/71
[58] Field of Search .............. 357/15, 30, 68, 71

[56] References Cited

U.S. PATENT DOCUMENTS 4,771,017 9/1988 Tobin et al. ............ 437/203
4,889,565 12/1989 Fan et al. ............... 357/30

OTHER PUBLICATIONS

"High Temperature Contact Metallization for Advanced Solar Cells", Horne et al., Aug. 1984; pp. 1–64.
"Development of Metallization for GaAs and AlGaAs Concentrator Solar Cells", Stephen P. Tobin; Apr. 1987; pp. 1–104.
Publication–Fourteenth IEEE Photovoltaic Specialists Conference (1980), Gonzalez and Weaver.
Publication of Green et al., (1984), discloses the use of silicon solar cells.
Publication of Waldrop (1982), use of evaporated Schottky barrier contacts to gallium arsenide surfaces.
Publication of Maki and Ehrlich (1987), method of forming diode structures on gallium arsenide materials.
Publication of Kuriyama (1987), discloses the use of tungsten and silicon to form Schottky barrier diodes w/ gallium arsenide surfaces.
Publication of Yu et al., (1986), formation of tungsten gallium arsenide Schottky barrier diodes.
Publication of Waldrop et al., (1982), use of refractory metals to form Schottky barrier contacts to GaAs.
Publication of Bater et al., (1987), discloses the deposition of tungsten an GaAs to form Schottky barrier structures.
Publication of Callegari et al., (1987), use of tungsten in forming Schottky contacts to n-GaAs surfaces.
Publication of Rasch & Roy (1981), Use of Silicon Bypass Diodes Having a Structure Shown in FIG. 2.
Publication of Cox et al. (1982), Use of Bypass Diodes, p. 835.

*Primary Examiner*—Mark V. Prenty
*Attorney, Agent, or Firm*—Hamilton, Brook, Smith & Reynolds

[57] ABSTRACT

A high temperature Schottky barrier diode utilizing a refractory metal with a p-type gallium arsenide wafer can be used as a by-pass diode for solar cell arrays. The diode structure can be integrally formed with a solar cell having a high temperative metallized contact grid.

15 Claims, 5 Drawing Sheets

HIGH TEMPERATURE SCHOTTKY BARRIER BYPASS DIODES

This is a continuation of co-pending application Ser. No. 07/428,124 filed on Oct. 27, 1989 now abandoned.

BACKGROUND OF THE INVENTION

Photovoltaic arrays require internal by-pass diodes to increase reliability. The diodes serve to make possible desirable reverse current flows which allow the series string to function in the case of a cell open circuit. A typical circuit employs a by-pass loop with a single diode around each solar cell or a series of cells. Note that if a cell is damaged so that the cell becomes an open circuit, the by-pass diode permits current flow in the series string. Thus, with by-pass diodes in the circuit, a failure of a single cell does not cause the failure of all the cells in the string. For the case of the shading of the cell, the by-pass diode prevents a cell string from overheating owing to the reverse bias condition that results from the shadow. Survivable space arrays of solar cells require by-pass diodes in order to prevent string failure owing to the failure of a single cell during high temperature events or other threats to efficient device operation.

It is known that solar cell by-pass diodes have used discrete components where the diode for each solar cell is placed in proximity to another cell in the array to prevent the failure of both the solar cell and its by-pass diode.

Desirable features of by-pass diodes are the following: highest possible forward bias saturation current, and lowest possible reverse saturation current. Low reverse saturation current reduces the parasitic losses from the by-pass diode during ordinary operation (in which the by-pass diode is in reverse bias), while high forward current yields low losses in the by-pass diode when it is in forward bias and compensating for a failed cell. Other desirable features of by-pass diodes include high current carrying ability, fast turn-on time, and small size. Existing by-pass diodes are generally discrete components that fail to maintain device performance at high temperatures. Thus there is a need for a diode structure that can operate or survive a high temperature environment and which maintains the above-referenced device characteristics.

SUMMARY OF THE INVENTION

The present invention relates to a high temperature survivable Schottky barrier diodes and the fabrication and use of such diodes in an integrated structure with a solar cell.

A preferred embodiment of the diode is formed with a wafer of gallium arsenide on which a p-type epitaxial layer of gallium arsenide has been formed. A layer of a refractory metal, preferably tungsten, is deposited by vacuum, CVD, or other suitable deposition process, on the surface of the epitaxial material to form the Schottky barrier. Contacts are formed on or over the refractory metal and on the back surface of the wafer.

Another preferred embodiment of the invention utilizes a diffusion barrier formed of TiWN or TiN interposed between the refractory metal and the overlying contact region to minimize the diffusion of arsenic from the wafer and epitaxial material that can occur during operation of the device, particularly at high temperatures; and to minimize diffusion of the overlying contact metal through the tungsten.

The above diode structure is preferably formed as an integrated structure with a solar cell in which the mesa structure having a p-n junction is formed in the epitaxial gallium arsenide layer that is adjacent to the region in which the diode is formed. The diode operates to by-pass another solar cell that is placed in series with the solar cell to which the by-pass diode is physically joined. Thus, the diode of the present circuit is not used to by-pass the solar cell with which it is integrated. The entire integrated structure can be formed with the high temperature metallization system common to both.

A further preferred embodiment employs an integrated structure where the diode of the structure serves as the by-pass diode for solar cell to which it is physically joined.

Note that other III-V materials such as indium phosphide can be used to form the by-pass diode of the present invention. In addition, for certain applications the diodes can be formed using silicon as the semiconductor material.

The above, and other features of the invention including various novel details of construction and combination of parts, will now be more particularly described with reference to the accompanying drawings and pointed out in the claims. It will be understood that the particular high temperature Schottky barrier diode and the integral structure embodying the invention is shown by way of illustration only and not as a limitation of the invention. The principal features of this invention may be employed in various embodiments without departing from the scope of the invention.

DETAILED DESCRIPTION OF THE INVENTION

Figure 1:
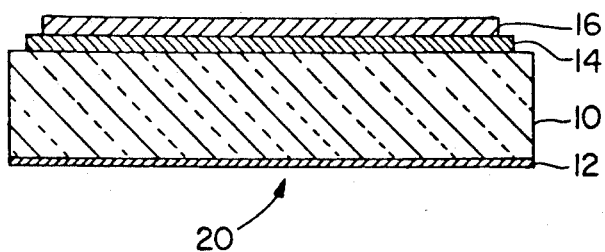
FIG. 1 is a sectional view of a preferred embodiment of the Schottky barrier diode of the present invention.

A preferred embodiment of the Schottky barrier diode 20 of the invention is illustrated in FIG. 1 in which a wafer 10 of p-type semiconductor material, preferably gallium arsenide, forms a rectifying junction with a layer of a refractory metal 14, preferably tungsten, titanium or similar elements or compounds thereof. The tungsten-GaAs Schottky barrier diode can be formed by deposition of tungsten on a GaAs surface. The tungsten-GaAs interface is stable at temperatures of up to about 800°. Thus, for temperatures in the range of 0° C. to 800° C., the tungsten-GaAs Schottky barrier is well suited to high temperature survivable diode applications. Note that front 16 contact pads are formed on the exposed regions of the tungsten layer 14. Note also the back contact 12 on the underlying surface of the wafer 10 can be formed having a high temperature metallized system. Such a back contact structure is more fully described in U.S. Ser. No. 07/250,388 filed on Sept. 28, 1988 and now abandoned which is incorporated herein by reference. The back contact 12 can comprise a tungsten layer contacting the back surface of the gallium arsenide wafer 10, as well as a conductive contact formed on the tungsten.

To improve the performance of the diode after cycling to these temperatures, it is also preferable to encapsulate the exposed GaAs. Such an encapsulated structure used for solar cells is more fully described in U.S. Pat. No. 4,889,565 filed on Aug. 20, 1987, the contents of which are incorporated herein by reference. Further it is preferable to form the bonding pads such that they overlie the encapsulation, rather than on the Schottky barrier surface itself. The encapsulation may be formed by silicon nitride, silicon oxy-nitride, or silicon dioxide.

Figure 2:
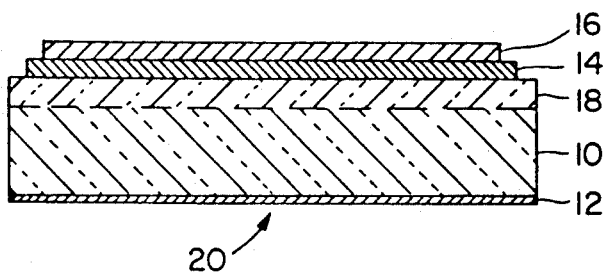
FIG. 2 is a sectional view illustrating the use of an epitaxial semiconductor layer to form the active semiconductor portion of the diode.

Epitaxial layers of GaAs, AlGaAs, or other III-V materials can be used to improve the performance of the diode as illustrated in FIG. 2. The doping concentration of the epitaxial layer 18 which governs the reverse breakdown voltage can be varied during epitaxial growth to yield the desired reverse characteristics. In addition, recombination center impurities (such as Au) can be added to these layers to reduce the minority carrier generation and recombination lifetime, thereby affecting a reduction in the response time of the diode. This is particularly important for by-pass diodes where a fast response time is essential to maintain solar cell array operation without interruption upon the failure of one or more cells. The epitaxial layer can have a thickness in the range of 2-10 microns, but can be outside this range depending upon the desired application. However, note that in certain applications, as seen in FIG. 1 the addition of an epitaxial layer is not necessary when using a suitably doped substrate wafer.

Figure 6:
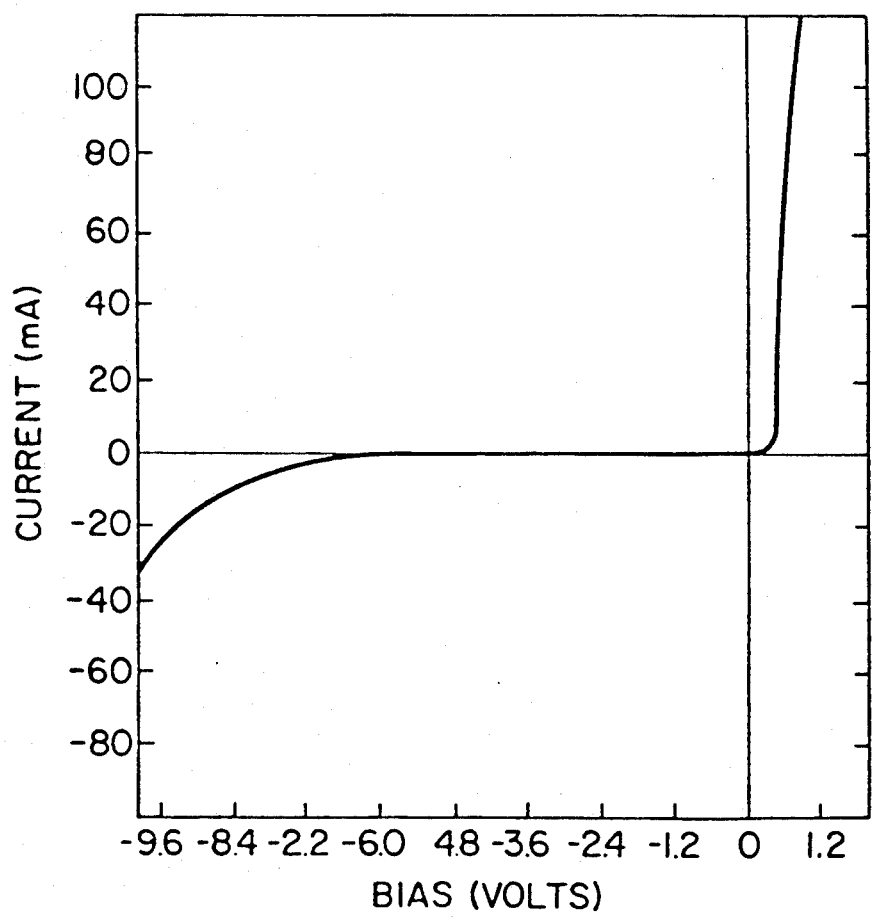
FIG. 6 is a graphical representation of the current-voltage characteristic of the Schottky barrier by-pass diode of the present invention.
Figure 7:
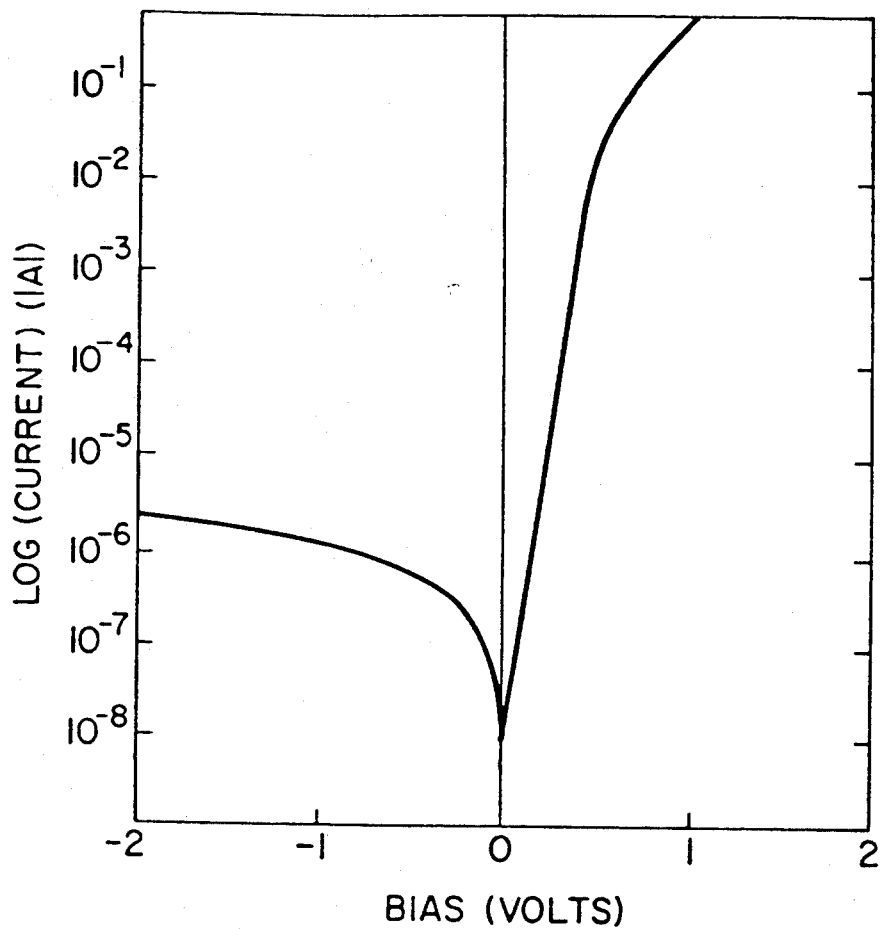
FIG. 7 is a graphical representation on a logarithmic scale of the forward and reverse current-voltage characteristics of the Schottky barrier by-pass diode of the present invention.

Typical non-limiting dimensions of a finished diode depicted in FIG. 2 are approximately 0.02"×0.02"×0.015". Typical current carrying ability is up to about 1 ampere and is proportional to diode cross sectional area. Typical turn-on time is 1 to 15 nanoseconds and the typical current at a reverse bias of 1 V is 1 to 2 microamperes. This structure produces a forward current at 0.7 V of about 0.1 ampere. These characteristics are illustrated in FIGS. 6-7 which depict the current-voltage characteristics of the present device.

Figure 3:
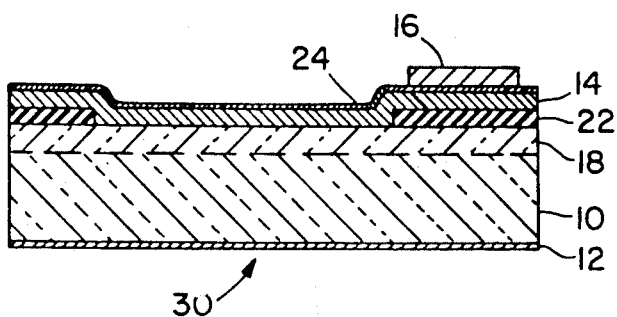
FIG. 3 is a sectional view illustrating an embodiment employing a high temperature survivable metallization system.

FIG. 3 illustrates another preferred embodiment of the invention in which the region of the rectifying junction of the diode 30 is defined by an insulating layer 22 formed on the periphery of the epitaxial layer 18. The insulating material 22 can be a silicon nitride, silicon dioxide, or a silicon oxy-nitride which also serves to encapsulate the underlying gallium arsenide material. In addition the gallium arsenide 18 and tungsten layer 14 can be isolated from the contact metal 55 by a diffusion barrier 24 used to prevent migration of arsenic from the gallium arsenide and to prevent the migration of the overlying grid conductor into the semiconductor. This is particularly important for systems being exposed to high temperature environments or excursions. Note also that the contact pad for the diode does not overlie the diode structure thereby minimizing stress on the diode junction.

Figure 4:
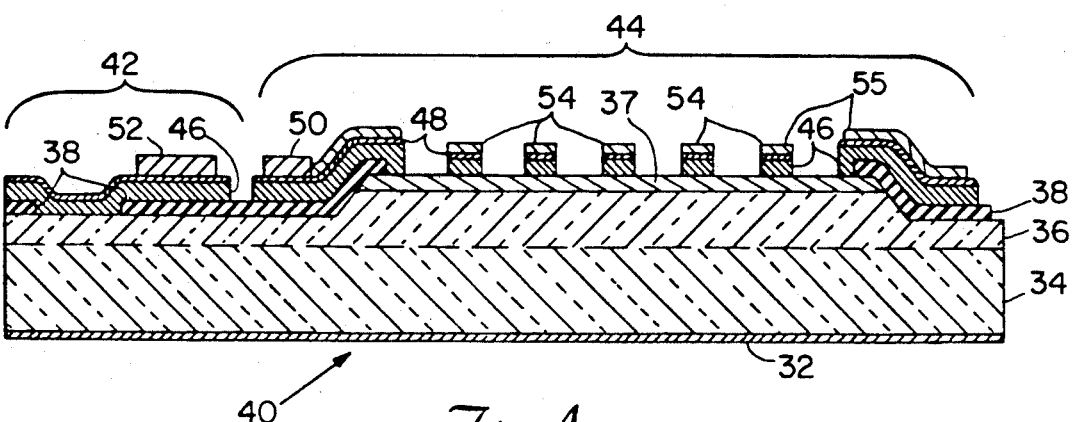
FIG. 4 is a sectional view illustrating an integrated diode/solar cell structure having a by-pass diode and a solar cell formed in a wafer of semiconductor material.

An integrated by-pass diode solar cell device 40 is illustrated in FIG. 4. This embodiment utilizes a structure 42 similar to that of FIG. 3 integrally formed with a solar cell 44. The solar cell has a mesa type structure as described in the above-referenced U.S. Pat. No. 4,889,565. The light incident surface of the cell has a grid structure 54 to collect current from the light incident surface of the cell. The grid preferably comprises a tungsten layer 46 in contact with the top surface of the mesa. A conductive diffusion barrier 48 can be used to isolate the gallium arsenide from any overlying conductive material such as the front contact pads 50 and 52 for the cell 44 and the diode 42 respectively. The current carrying portions of the grid 54 extend to the contact pads thereby minimizing stress on the junction of the cell defined by the perimeter of the mesa.

Figure 5:
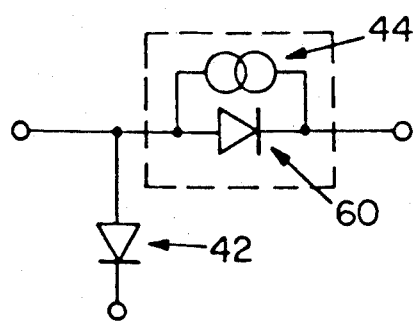
FIG. 5 is a schematic circuit diagram of the embodiment shown in FIG. 4.

The diode 42 is used to by-pass another diode (not shown) that is in series circuit with cell 44, as well as other cells within the array. As shown in FIG. 5 the cell 44, of the structure of FIG. 4, is integrally formed with diode 42. The diode 60 represents the internal resistance of the cell which also exhibits rectifying behavior. Thus a number of the devices 40 of FIG. 4 can be placed in series to form a high temperature solar cell array in which each device 40 has a by-pass diode for the cell of the adjacent device in the array.

The cell 44 and diode 42 can be produced during the same sequence of processing steps as illustrated in FIGS. 8A-8G.

Figure 8:
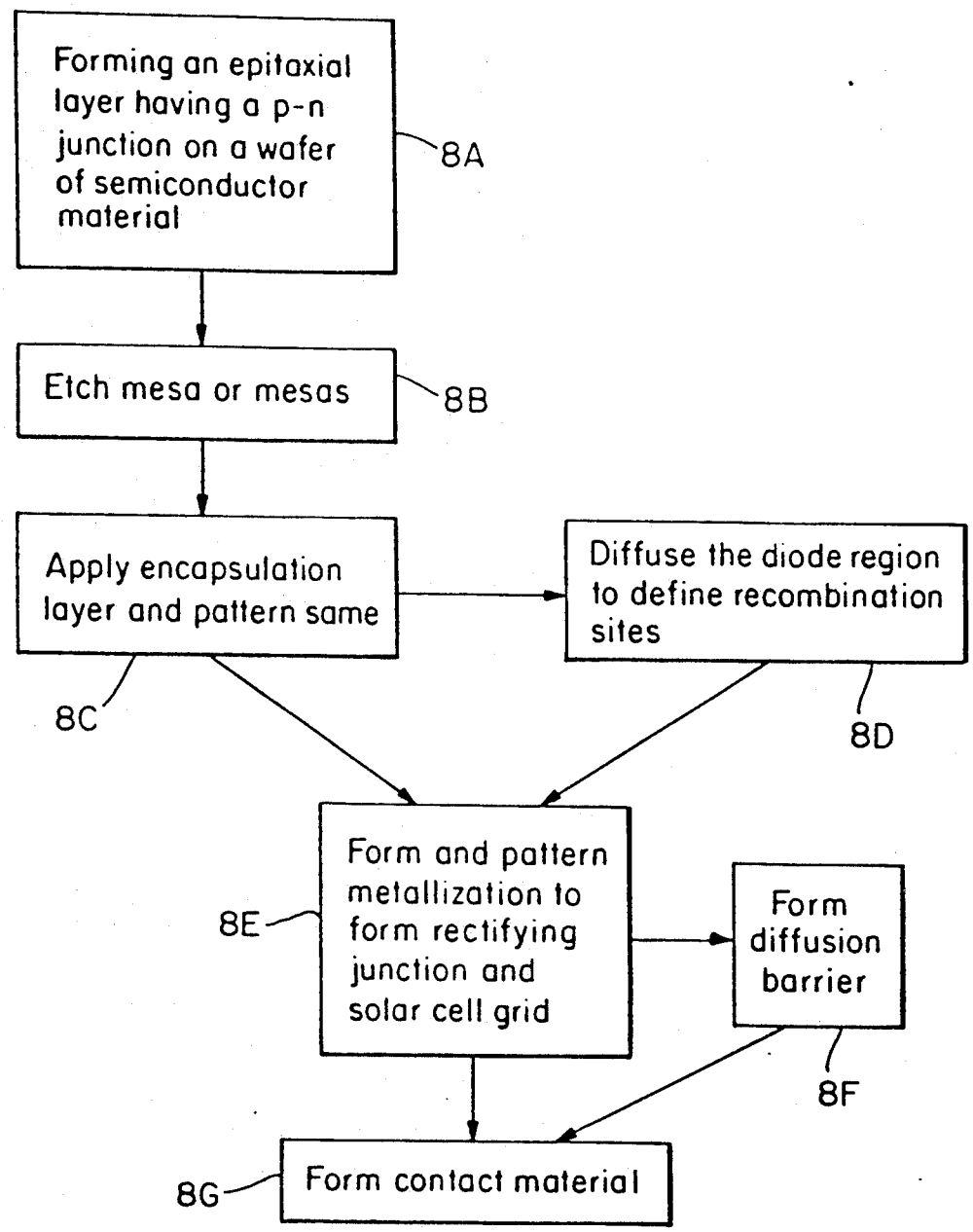
FIGS. 8A-8G is a process flow diaphragm illustrating a procedure for producing the integrated structure for FIG. 4.

First, a wafer of the desired semiconductor material is provided and an epitaxial layer is optionally formed thereon, as seen in FIG. 8A, the layer having a p-n junction. The epitaxial layer or exposed semiconductor surface is than etched in FIG. 8B to form a mesa for the solar cell, and optionally form a mesa for the diode as described hereinafter.

As seen in FIG. 8C an insulating material is then formed over selected regions to define the area for each device of the structure and to encapsulate the underlying semiconductor.

Illustrated in FIG. 8D is the optional step of diffusing or inserting an impurity to define recombination sites in the semiconductor material to adjust the response time of the diode.

A metallization structure is then formed at FIG. 8E to provide the collection grid for the solar cell and simultaneously form the rectifying junction of the diode. The tungsten or other refractory metal that contacts the semiconductor surface thus forms an ohmic contact to the n-type light incident surface material of the solar cell 44 of FIG. 4, and during the same step, forms the rectifying junction to the p-type material for the diode 42.

As illustrated at FIG. 8E, a diffusion barrier can optionally be formed over the existing metallized contact structure to prevent the migration of arsenic from within the semiconductor material and prevent the migration of any overlying metal into each device.

Following formation of the metallization, the contact pads or regions are formed, as seen in FIG. 8G and the entire device is optionally encapsulated using an insulating or antiflective material.

Figure 9:
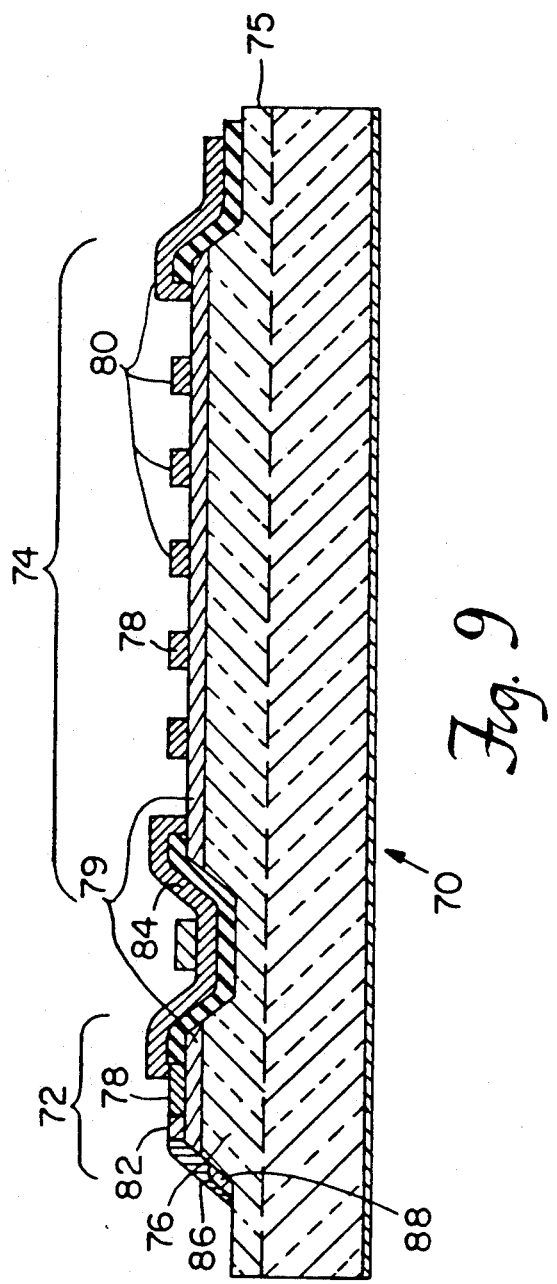
FIG. 9 is a sectional view of another preferred embodiment in which the by-pass diode is integrated with the solar cell which it serves to by-pass.
Figure 10:
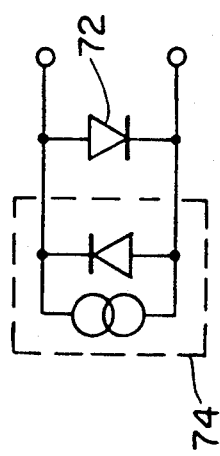
FIG. 10 is a schematic circuit diagram for the embodiment of FIG. 9.

Another preferred embodiment of the invention is shown in FIG. 9 where an integrated structure 70 is formed in which the diode 72 serves as the by-pass diode for the solar cell 74 to which it is physically joined. FIG. 10 shows a schematic circuit diagram for the device shown in FIG. 9.

Note that a separate mesa 76 has been formed for the diode 72 where a p-n junction is present on the upper surface of both mesas. The refractory metal 78 is formed on the surface of the solar cell mesa as a grid 80 and on a selected portion of the diode mesa to form the rectifying junction. The metal 78 of the grid 80 is conductively connected with the metal 78 forming the diode region by connector layer 84. Adjacent the refractory metal 78 on the diode mesa is a separate ohmic contact material 82. This ohmic contact 82 to the n-type material of the diode is conductively connected by metal connector 86 to a second ohmic contact material 88 that contacts the p-type material that forms the junction within the diode mesa.

I claim:

1. An integrated structure for a solar cell by-pass diode comprising:
   an epitaxial layer of a semiconductor material formed on a semiconductor substrate;
   a first solar cell formed on a surface portion of the epitaxial layer;
   a second solar cell electrically connected in series with the first solar cell; and
   a by-pass diode electrically connected in parallel with the first solar cell to form a by-pass circuit, the circuit comprising a metallized layer contacting a second surface portion of the epitaxial layer to form the by-pass diode, the metallized layer having an electrical contact such that the diode is electrically connected, through the electrical contact, to the second solar cell and is electrically connected to the first solar cell through the epitaxial layer.

2. The integrated structure of claim 1 wherein the epitaxial layer comprises gallium arsenide.

3. The integrated structure of claim 1 wherein the metallized layer comprises a refractory metal.

4. The integrated structure of claim 3 wherein the refractory metal comprises tungsten.

5. The integrated structure of claim 1 further comprising a diffusion barrier between the metallized layer and a contact layer.

6. A high temperature Schottky barrier diode structure comprising:
   a layer of p-type gallium arsenide having a front surface and a back surface, the back surface being connected to an electrically conductive back contact;
   a refractory metal layer formed on the front surface of the gallium arsenide layer to form a rectifying junction of the diode, the diode junction extending over a junction area with the refractory metal layer covering substantially the entire junction area of the diode;
   a conductive diffusion barrier formed on the refractory metal layer; and
   a conductive contact region formed on the diffusion barrier.

7. The high temperature diode structure of claim 6 further comprising a solar cell formed in the p-type gallium arsenide layer to form an integral by-pass diode solar cell.

8. The high temperature diode structure of claim 7 further comprising a conductive grid of tungsten contacting the light incident surface of the solar cell.

9. The high temperature diode structure of claim 6 wherein the back contact comprises a tungsten layer contacting a back surface of the gallium arsenide layer and a conductive contact region formed on the tungsten layer.

10. An integrated structure for a by-passed solar cell array comprising:
    a plurality of solar cells, each cell being formed on a surface portion of an epitaxial layer formed on a semiconductor substrate, each solar cell having a light incident surface with an electrically conductive grid extending over the light incident surface;
    a by-pass circuit for each solar cell of the solar cell array comprising a metallized layer contacting a second surface portion of the epitaxial layer that is separated from the light incident surface of each solar cell, the metallized layer and the second surface portion of the epitaxial layer forming a rectifying junction of a diode that is electrically connected in parallel with the solar cell of each by-pass circuit.

11. The integrated structure of claim 10 further comprising a diffusion barrier between the metallized layer and a contact to the diode.

12. The integrated structure of claim 10 wherein the epitaxial layer comprises gallium arsenide.

13. The integrated structure of claim 10 wherein the metallized layer comprises a refractory metal.

14. The integrated structure of claim 13 wherein the refractory metal comprises tungsten.

15. The integrated structure of claim 10 wherein the solar cell grid is electrically connected to the metallized layer.

* * * * *